United States Patent [19]

Byers et al.

[11] Patent Number: 5,416,362
[45] Date of Patent: May 16, 1995

[54] TRANSPARENT FLIP-FLOP

[75] Inventors: Larry L. Byers, Apple Valley, Minn.; Fernando W. Arraut, San Diego, Calif.; Dale K. Seppa, New Brighton, Minn.

[73] Assignee: Unisys Corporation, Blue Bell, Pa.

[21] Appl. No.: 119,957

[22] Filed: Sep. 10, 1993

[51] Int. Cl.6 .................... H03K 3/037; H03K 3/289
[52] U.S. Cl. ................................. 327/202; 327/219
[58] Field of Search ............... 307/272.2, 272.1, 289; 328/754, 191, 206

[56] References Cited

U.S. PATENT DOCUMENTS

| | | | |
|---|---|---|---|
| 4,424,581 | 1/1984 | Kawai | 307/272.2 |
| 4,495,629 | 1/1985 | Zasio et al. | 307/272.2 |
| 4,616,338 | 10/1986 | Helen et al. | 364/900 |
| 4,682,329 | 7/1987 | Kluth et al. | 371/15 |
| 4,689,497 | 8/1987 | Umeki et al. | 307/272.2 |
| 4,698,830 | 10/1987 | Barzilai et al. | 307/272.2 |
| 4,864,161 | 9/1989 | Norman et al. | 307/272.2 |
| 4,871,930 | 10/1989 | Wong | 307/465 |
| 4,903,223 | 2/1990 | Norman et al. | 307/465 |
| 4,940,909 | 7/1990 | Mulder et al. | 307/465 |
| 4,975,595 | 12/1990 | Roberts et al. | 307/272.2 |
| 5,003,204 | 3/1991 | Cushing et al. | 307/272.2 |
| 5,004,933 | 4/1991 | Widener | 307/269 |
| 5,015,875 | 3/1991 | Giles et al. | 307/272.2 |
| 5,095,454 | 3/1992 | Huang | 364/578 |
| 5,130,568 | 7/1992 | Miller et al. | 307/272.2 |
| 5,140,176 | 8/1992 | Okino | 307/272.2 |
| 5,148,052 | 9/1992 | Yellamilli | 307/272.1 |
| 5,155,382 | 10/1992 | Madden et al. | 307/272.2 |
| 5,162,667 | 11/1992 | Yasui et al. | 307/272.2 |
| 5,164,612 | 11/1992 | Kaplinsky | 307/272.2 |
| 5,173,626 | 12/1992 | Kudou et al. | 307/272.2 |
| 5,175,447 | 12/1992 | Kawasaki et al. | 307/272.2 |
| 5,189,315 | 2/1993 | Akata | 307/272.2 |
| 5,233,638 | 8/1993 | Moriwaki et al. | 307/272.2 |

*Primary Examiner*—Timothy P. Callahan
*Assistant Examiner*—T. Lam
*Attorney, Agent, or Firm*—Nawrocki, Rooney & Sivertson

[57] ABSTRACT

An apparatus for a transparent master/slave flip-flop logic circuit including a single line connected to the transparency input of the logic macro so that when the line is active input data will pass through the flip-flop, unless the scan signal is also active, in which case the flip-flop will return to a clocked (latching) status.

12 Claims, 2 Drawing Sheets

| INPUTS | | | | | | | | | STATE | OUTPUTS | | |
|---|---|---|---|---|---|---|---|---|---|---|---|---|
| CLR | PSET | TEN | SDI | SCAN | D | EN1 | EN2 | CP | MQ | Q | QB | SDO |
| H | X | X | X | X | X | X | X | X | L | L | H | L |
| L | H | X | X | X | X | X | X | X | H | H | L | H |
| L | L | X | SDI | H | X | X | X | X | SDI | SQ' | SQB' | SQ' |
| L | L | X | SDI | H | X | X | X | LTH | SDI | SDI | SDIB | SDI |
| L | L | H | X | L | D | X | X | X | D | D | DB | D |
| L | L | L | X | L | D | H | H | L | D | SQ' | SQB' | SQ' |
| L | L | L | X | L | D | H | H | LTH | D | D | DB | D |
| L | L | L | X | L | X | H | L | X | MQ' | SQ' | SQB' | SQ' |
| L | L | L | X | L | X | L | H | X | MQ' | SQ' | SQB' | SQ' |
| L | L | L | X | L | X | L | L | X | MQ' | SQ' | SQB' | SQ' |

FIG. 2

TRANSPARENT FLIP-FLOP

BACKGROUND OF THE INVENTION

1. Field of the Invention

The present invention relates generally to bistable multivibrators as used in logic design, and more particularly to a master/slave flip-flop.

2. Description of the Prior Art

The use of multivibrators in logic design is well known to those of reasonable skill in the art, as is the more specific use of a master/slave flip-flop. This form of macro has been used virtually throughout the field of logic systems and has been used successfully as a versatile design tool for many logic purposes.

U.S. Pat. No. 5,164,612, to Kaplinsky which describes a master/slave flip-flop which is altered to selectively become transparent to the data signal. This purpose is accomplished by the addition of a new driver stage within the flip-flop, or by the addition of multiplexers to provide, for example, the necessary "latch" or "unlatch" signals to the master/slave flip-flop.

A plurality of flip-flops (memory cells) that are programmed by a user to create the desired architecture for the device in use is described in U.S. Pat. No. 4,940,909, to Mulder, et al. A plurality of shift registers are connected to the flip-flops for storage of the programming signal so that it is not destroyed during testing of various architectural configurations.

U.S. Pat. No. 4,616,338, to Helen, et al, in which a FIFO type temporary storage system utilizes registers which may comprise a plurality of transparent data type flip-flops for the storage and adds further handling logic for controlling the register flip-flops. Data type flip-flops may be rendered transparent by holding the clock to a high state. However, such flip=flops are not useful for applications which cannot tolerate the relatively lengthly metastable state.

U.S. Pat. No. 5,095,454, to Huang, in which a system for verifying timing during path tracing through digital circuitry uses flip-flops as the path end points, which flip-flops may be of a transparent latch-based design. This design utilizes the clock signal as the transparency input to the flip-flop, and when the block is not present the macro reverts to latching;

A phase-selectable flip-flop has an input transparent latch which makes the output flip-flop switch from transparency to latching depending on the phase of the clock signal in U.S. Pat. No. 5,004,933, to Widener.

U.S. Pat. No. 5,155,382, to Madden, et al, in which a master/slave flip-flop is connected to the clock signal in a manner intended to prevent a race-through condition.

Though data type flip-flops may be rendered transparent using only the clock signal, such devices are not useful for many data latching functions. However, because of the added complexity of master-slave flip-flops, programmable transparency is not easily accomplished for the enhanced testing advantages it offers. As can be seen, the prior art devices tend to add great complexity to the system, thus exacerbating rather than improving reliability and maintainability.

SUMMARY OF THE INVENTION

The present invention overcomes the disadvantages found in the prior art by providing a single enable line to provide signal transparency to a master/slave flip-flop. When the line is enabled the flip-flop macro is transparent and when the line is disabled the macro returns to the latching state as in a conventional bistable multivibrator. Thus the need for additional circuitry is obviated. In the preferred embodiment of this invention, input data flows through the flip-flop circuit without manipulation or change when the transparency line is active, unless the scan signal is also active, in which case the flip-flop again returns to conventional operation and the incoming data is latched or clocked through the system.

The transparent flip-flop of this invention provides a useful technique for accessing board level information as may be required for system content validation ("probe") initialization and maintenance. It can also be used to separate large logic partitions of combinational logic into smaller, more manageable partitions, for example in automatic test vector generation tools. It is further useful to read embedded random access memory (RAM) when a latching function is required. The board level information can be used to parameterize the internal logic of the device. When the flip-flop of this invention is in the transparent mode the board level information is fed directly through the flip-flop to the internal logic it is to control.

As there is no need for complex multiplexing circuitry to provide the transparency function needed to perform the above described or other uses of the apparatus of this invention, there is a distinct savings of hardware as well as a significantly faster design when compared to a design using multiplexers. Further, the transparent flip-flop of this invention eliminates the need for functional clocking at the described level of logic.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
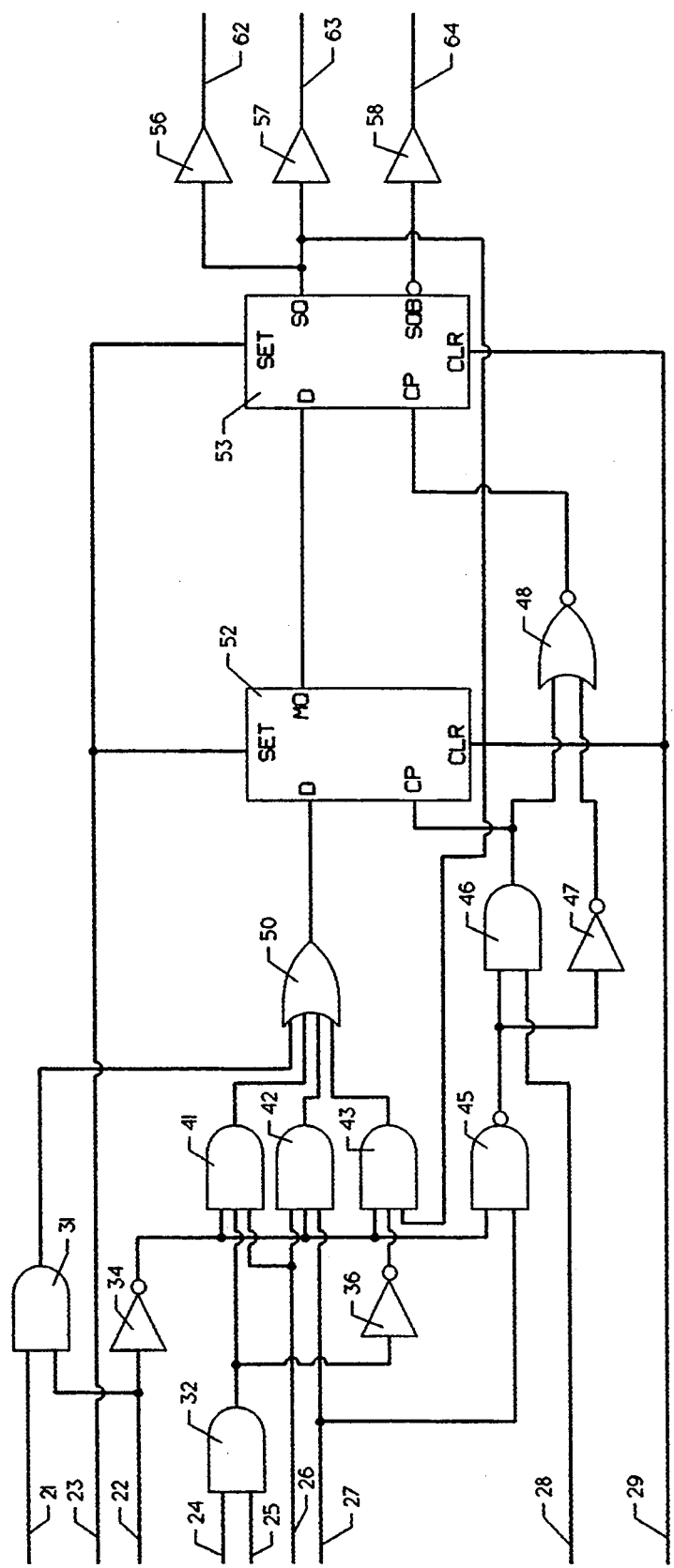
FIG. 1 is a block diagram showing the logic circuitry of the flip-flop of this invention; and, FIG. 2 is a truth table depicting the logical sequences of operation of the flip-flop macro of this invention.

FIG. 1 is a logic block diagram of a preferred embodiment of this invention. A pair of bistable multivibrators or flip-flops, 52 and 53, are connected as a master/slave pair, with flip-flop 52 being the master to slave flip-flop 53. Each of flip-flops 52 and 53 is shown as having a clear (CLR) input, a set (SET) input, a clock (CP) input and a data (D) input. In addition, master flip-flop 52 is shown with a master true output (MQ), and slave flip-flop 53 is shown with a slave true output (SQ) and a slave false output (SQB). Output MQ of flip-flop 52 is connected to input D of flip-flop 53.

As shown, the transparent flip-flop circuit of this invention has nine input lines 21–29, and three output lines 62–64. The nine inputs include a clear input (CLR) on line 29, which when active (high), sets the master/slave flip-flops 52 and 53 to the zero or false state. The preset input (PSET) on line 23 when high sets master slave flip-flops 52 and 53 to the one or true state. A transparent enable input (TEN) on line 27 prevents the master/slave flip-flop 52 and 53 from storing states thus rendering the master/slave pair transparent to data input in a manner more fully described below. The scan data input (SDI) signal on line 21 provides opportunity to read the state of the circuit. A scan select input (SCAN) signal on line 22 blocks the TEN input at 27 from reaching the master/slave flip-flop 52–53 enabling the flip-flop to return to the store state. The functional data in input (D) signal on line 26 is the actual one bit data input. The function-scan clock input (CP) signal on line 28 is used both functionally and for scanning. A first function enable input (EN1) signal on line 24 and a second function enable input (EN2) signal on line 25, which when both are active (high), cause the master/slave pair 52–53 to store the state of the input data on line 26 in response to a clock pulse on line 28. When either of input lines 24 or 25 is inactive (low) and the master/slave pair 52–53 is clocked from input 28, the previous stored state of flip-flop 52–53 will be held.

Output line 62 of FIG. 1 provides the scanned data output. Output line 63 provides a slave true output (Q), and output line 64 provides the slave false state (QB). Line 62 is connected to the output of a driver 56, line 63 is connected to the output of a driver 57, and line 64 is connected to the output of a driver 58.

Referring further to FIG. 1, there are shown a plurality of AND gates 31, 32, 41, 42, 43 and 46, a NAND gate 45, an OR gate 50, a NOR gate 48 and a plurality of invertors 34, 36 and 47. SDI input line 21 is connected to one of two inputs to AND gate 31. The other input of gate 31 is connected to SCAN input line 22. The output of gate 31 is connected to one of four inputs to OR gate 50.

Line 22 is also connected to the input of invertor 34. The output of invertor 34 is connected to one of three inputs on each of AND gates 41, 42 and 43, and is also connected to one of two inputs on NAND gate 45.

PSET input line 23 is connected directly to the SET inputs on each of flip-flops 52 and 53. CLR input line 29 is connected directly to the CLR inputs on each of flip-flops 52 and 53. CP input line 28 is connected to the other input of gate 46. TEN input line 27 is connected to a second input of gate 42 and to the other input of NAND gate 45. The output of gate 45 is connected to one of two inputs to AND gate 46, and through invertor 47 to one of two inputs to NOR gate 48. The output of gate 46 is connected to the CP (clock) input of flip-flop 52, and to the other input of NOR gate 48. The output of gate 48 is connected to the CP input of flip-flop 53.

D input line 26 is connected to a second input of AND gate 41 and to the other input of AND gate 42. The output of gate 42 is connected to a second input of OR gate 50. EN1 input line 24 is connected to one of two inputs on AND gate 32. EN2 input line 25 is connected to the other input of gate 32. The output of gate 32 is connected to the other input of AND gate 41, and is also connected through invertor 36 to a second input of AND gate 43. The output of gate 41 is connected to a third input of OR gate 50. Slave true output SQ of flip-flop 53 is connected to the other input of gate 43. The output of gate 43 is connected to the other input of OR gate 50.

The output of or gate 50 is connected to the data (D) input of flip-flop 52. The master true (MQ) output of flip-flop 52 is connected to the D input of slave flip-flop 53. The slave true output (SQ) is further connected to the input of each of drivers 56 and 57. The slave false output (SQB) is connected to the input of driver 58. Driver 56 may be, for example, a four fan-out expansion driver, while drivers 57 and 58 may be, for example, twelve fan-out expansion drivers.

FIG. 2 is a truth table for the circuit of the preferred embodiment of the present invention. It can be seen that the table defines the outputs produced by the transparent flip-flop of this invention. LTH means low-to-high transition, MQ is the state of the internal master latch of the logic macro, i.e. the state of flip-flop 52, and SQ', MQ' and SQB' are previous states of Q, MQ, and QB.

The table of FIG. 2 provides the necessary information to determine the output of the logic macro (SDO) on output line 62 in accordance with any one of a variety of signal combinations appear at input lines 21–29. In a first example, if CLR input line 29 is made active (high) while all other inputs are low, flip-flops 52 and 53 will be cleared and the SDO output at output line 62 will be low, the Q output at line 63 will also be low and it follows that the QB output on line 64 will be high. If the PSET input line 23 is the only active input, the master/slave flip-flops 52 and 53 will be set and the SDO output at output line 62 as well as the Q output at line 63 will be high, while the QB output on line 64 will be low. This result is clear from the truth table of FIG. 2 and can be seen as well by reviewing the diagram of FIG. 1 where it is readily apparent that CLR input line 29 is directly connected to clear flip-flops 52 and 53, and PSET input line 23 is directly connected to set flip-flops 52 and 53.

Another example of what can be read from the table of FIG. 2 involves the transparency feature of this invention. When the signal at TEN input line 27 is high and the signal at SCAN input input line 22 is low, the table reveals that data appearing at D input line 26 will be passed directly through to SDO output line 62. The hardware to accomplish this result is found in FIG. 1. When line 27 is high and line 22 is low, the signal from line 22 will pass through invertor 34 to enable its input to AND gate 42. Thus as a data signal appears at input line 26, it will be free to pass through gate 42 and thence through OR gate 50 to the D inputs, in turn, of master/slave flip-flops 52 and 53. The signal finally appears unchanged at SDO output line 62. Note that the signal from TEN input line 27 will also disable NAND gate 45. This means that the output of gate 45 will be low thus disabling AND gate 46 to prevent any clock signals from CP input line 28 from reaching the CP input on master flip-flop 52. The output of gate 45 will also pass through invertor 47 to present a high signal to NOR gate 48, thus preventing any clock pulses from reaching the CP input of slave flip-flop 53.

Yet another reading to be taken from the table of FIG. 2 is that when both of input lines 24 and 25 (EN1 and EN2) are high and a clock signal appears on CP input line 28, data appearing at D input line 26 will be stored in the flip-flop circuitry of this invention. Conversely, if either of EN1 or EN2 input lines 24 and 25 is low and a clock signal appears at line 28, then previous data is "held" by the pair of flip-flops 52 and 53.

The above set of examples are indicative of how the truth table of FIG. 2 can be used to read the operation of the apparatus of this invention as shown in the logic block diagram of FIG. 1. As a last example, assume that both SDI input line 21 and SCAN input line 22 are active (high). This will enable gate 31 to in turn enable OR gate 50 and pass the SDI signal to the D input of master flip-flop 52. However, the transparency feature will not be invoked because the signal at input lines 22 and 27 will enable NAND gate 45 which will in turn enable one input to AND gate 46 so that clock pulses appearing on line 28 will be passed to the CP input of flip-flops 52 and 53 thus causing the master/slave pair to act as a normal latching flip-flop when receiving scan data input.

Having thus described the preferred embodiments of the present invention, those of skill in the art will readily appreciate the other useful embodiments within the scope of the claims hereto attached.

We claim:

1. Transparent bistable storage apparatus comprising:
  a. a master latch having a SET input port, a CLEAR input port, a DATA input port, a CLOCK input port, and a Q output port for latching data when said CLOCK input port is in a predefined state and for becoming transparent when said CLOCK input port is in the complement of said predefined state;
  b. a slave latch having a SET input port, a CLEAR input port, a DATA input port, a CLOCK input port, and a Q output port for latching data when said CLOCK input port is in a predefined state and for becoming transparent when said CLOCK input port is in the complement of said predefined state and wherein said DATA input port of said slave latch is coupled to said Q output port of said master latch;
  c. a PSET input pin coupled to said SET input port of said master latch and to said SET input port of said slave latch for placing a logic-1 in said master latch and said slave latch when said PSET input pin contains a signal having a predefined logic level;
  d. a CLEAR input pin coupled to said CLR input port of said master latch and to said CLR input port of said slave latch for placing a logic-0 in said master latch and said slave latch when said CLEAR input pin contains a signal having a predefined logic level;
  e. a first NOR gate having input ports NOR1, NOR2, NOR3, and NOR4 and output port NOROUT wherein said NOROUT output port of said first NOR gate is coupled to said DATA input port of said master latch;
  f. a first AND gate having input ports AND1, AND2 and output port ANDOUT wherein said AND1 input port of said first AND gate is coupled to a SDI input pin and said AND2 input port of said first AND gate is coupled to a SCAN input pin and wherein said ANDOUT output port of said first AND gate is coupled to said NOR1 input port of said first NOR gate;
  g. a first inverter having an INV1 input port and a INVOUT output port wherein said INV1 input port of said first inverter is coupled to said SCAN input pin;
  h. a second AND gate having input ports AND1, AND2 and output port ANDOUT wherein said AND1 input port of said second AND gate is coupled to a EN1 input pin and said AND2 input port of said second AND gate is coupled to a EN2 input pin;
  i. a second inverter having an INV1 input port and a INVOUT output port wherein said INV1 input port of said second inverter is coupled to said ANDOUT output port of said second AND gate;
  j. a third AND gate having input ports AND1, AND2, AND3 and output port ANDOUT wherein said AND1 input port of said third AND gate is coupled to said INVOUT of said first inverter and said AND2 input port of said third AND gate is coupled to said ANDOUT output port of said second AND gate and said AND3 input port of said third AND gate is coupled to a D input pin and wherein said ANDOUT output port of said third AND gate is coupled to said NOR2 input port of said first NOR gate;
  k. a fourth AND gate having input ports AND1, AND2, AND3 and output port ANDOUT wherein said AND1 input port of said fourth AND gate is coupled to said D input pin and said AND2 input port of said fourth AND gate is coupled to said INVOUT output port of said first inverter and said AND3 input port of said fourth AND gate is coupled to a transparent enable pin and wherein said ANDOUT output port of said fourth AND gate is coupled to said NOR3 input port of said first NOR gate;
  l. a fifth AND gate having input ports AND1, AND2, AND3 and output port ANDOUT wherein said AND1 input port of said fifth AND gate is coupled to said INVOUT of said first inverter and said AND2 input port of said fifth AND gate is coupled to said INVOUT output port of said second inverter and said AND3 input port of said fifth AND gate is coupled to said Q output port of said slave latch and wherein said ANDOUT output port of said fifth AND gate is coupled to said NOR4 input port of said first NOR gate;
  m. a first NAND gate having input ports NAND1, NAND2, and output port NANDOUT wherein said NAND1 input port of said first NAND gate is coupled to said INVOUT of said first inverter and said NAND2 input port of said first NAND gate is coupled to said transparent enable pin;
  n. a sixth AND gate having input ports AND1, AND2, and output port ANDOUT wherein said AND1 input port of said sixth AND gate is coupled to said NANDOUT output port of said first NAND gate and said AND2 input port of said sixth AND gate is coupled to a CLK input pin and wherein said ANDOUT output port of said sixth AND gate is coupled to said CLOCK input port of said master latch;
  o. a third inverter having an INV1 input port and an INVOUT output port wherein said INV1 input port of said third inverter is coupled to said NANDOUT output port of said first NAND gate; and
  p. a second NOR gate having input ports NOR1, NOR2, and output port NOROUT wherein said NOR1 input port of said second NOR gate is coupled to said ANDOUT output port of said sixth AND gate and said NOR2 input port of said second NOR gate is coupled to said INVOUT output port of said third inverter and wherein said NOROUT of said second NOR gate is coupled to said CLOCK input port of said slave latch.

2. Transparent bistable storage apparatus comprising:
  a. a master latch having a DATA input port, a CLOCK input port, and a Q output port for latching data when said CLOCK input port is in a predefined state and for becoming transparent when said CLOCK input port is in the complement of said predefined state;

b. a slave latch having a DATA input port, a CLOCK input port, and a Q output port for latching data when said CLOCK input port is in a predefined state and for becoming transparent when said CLOCK input port is in the complement of said predefined state and wherein said DATA input port of said slave latch is coupled to said Q output port of said master latch;

c. a first NOR gate having input ports NOR1, NOR2, NOR3, and NOR4 and output port NOROUT wherein said NOROUT output port of said first NOR gate is coupled to said DATA input port of said master latch;

d. a first AND gate having input ports AND1, AND2 and output port ANDOUT wherein said AND1 input port of said first AND gate is coupled to a SDI input pin and said AND2 input port of said first AND gate is coupled to a SCAN input pin and wherein said ANDOUT output port of said first AND gate is coupled to said NOR1 input port of said first NOR gate;

e. a first inverter having an INV1 input port and a INVOUT output port wherein said INV1 input port of said first inverter is coupled to said SCAN input pin;

f. a second AND gate having input ports AND1, AND2 and output port ANDOUT wherein said AND1 input port of said second AND gate is coupled to a EN1 input pin and said AND2 input port of said second AND gate is coupled to a EN2 input pin;

g. a second inverter having an INV1 input port and a INVOUT output port wherein said INV1 input port of said second inverter is coupled to said ANDOUT output port of said second AND gate;

h. a third AND gate having input ports AND1, AND2, AND3 and output port ANDOUT wherein said AND1 input port of said third AND gate is coupled to said INVOUT of said first inverter and said AND2 input port of said third AND gate is coupled to said ANDOUT output port of said second AND gate and said AND3 input port of said third AND gate is coupled to a D input pin and wherein said ANDOUT output port of said third AND gate is coupled to said NOR2 input port of said first NOR gate;

i. a fourth AND gate having input ports AND1, AND2, AND3 and output port ANDOUT wherein said AND1 input port of said fourth AND gate is coupled to said D input pin and said AND2 input port of said fourth AND gate is coupled to said INVOUT output port of said first inverter and said AND3 input port of said fourth AND gate is coupled to a transparent enable pin and wherein said ANDOUT output port of said fourth AND gate is coupled to said NOR3 input port of said first NOR gate;

j. a fifth AND gate having input ports AND1, AND2, AND3 and output port ANDOUT wherein said AND1 input port of said fifth AND gate is coupled to said INVOUT of said first inverter and said AND2 input port of said fifth AND gate is coupled to said INVOUT output port of said second inverter and said AND3 input port of said fifth AND gate is coupled to said Q output port of said slave latch and wherein said ANDOUT output port of said fifth AND gate is coupled to said NOR4 input port of said first NOR gate;

k. a first NAND gate having input ports NAND1, NAND2, and output port NANDOUT wherein said NAND1 input port of said first NAND gate is coupled to said INVOUT of said first inverter and said NAND2 input port of said first NAND gate is coupled to said transparent enable pin;

l. a sixth AND gate having input ports AND1, AND2, and output port ANDOUT wherein said AND1 input port of said sixth AND gate is coupled to said NANDOUT output port of said first NAND gate and said AND2 input port of said sixth AND gate is coupled to a CLK input pin and wherein said ANDOUT output port of said sixth AND gate is coupled to said CLOCK input port of said master latch;

m. a third inverter having an INV1 input port and an INVOUT output port wherein said INV1 input port of said third inverter is coupled to said NANDOUT output port of said first NAND gate; and n. a second NOR gate having input ports NOR1, NOR2, and output port NOROUT wherein said NOR1 input port of said second NOR gate is coupled to said ANDOUT output port of said sixth AND gate and said NOR2 input port of said second NOR gate is coupled to said INVOUT output port of said third inverter and wherein said NOROUT of said second NOR gate is coupled to said CLOCK input port of said slave latch.

3. Transparent bistable storage apparatus according to claim 1 wherein said apparatus being further operative such that when a selected signal appears at said transparency enable pin data appearing at said D input pin will pass directly through said at least one latch storage device to said at least one Q output port.

4. Transparent bistable storage apparatus according to claim 1 wherein said apparatus is further operative to block signals at the CLK input pin from reaching said at least one latch storage device in the presence of a selected signal at the transparency enable pin.

5. Transparent bistable storage apparatus according to claim 1 wherein said apparatus is further operative to prevent a signal at said transparency enable pin from reaching said at least one latch storage device in the presence of a selected signal at said SCAN input pin.

6. Transparent bistable storage apparatus according to claim 1 wherein said apparatus being further operative to pass signals at the D input pin and to pass signals at the CLK input pin to said at least one latch storage device such that the signals at the D input pin are latched through said at least one latch storage device.

7. Transparent bistable storage apparatus according to claim 5 wherein said apparatus being further operative to pass signals at the D input pin and to pass signals at the CLK input pin to said at least one latch storage device such that the signals at the D input pin are latched through said at least one latch storage device.

8. Transparent bistable storage apparatus according to claim 2 wherein said apparatus being further operative such that when a selected signal appears at said transparency enable pin, data appearing at said D input pin will pass directly through said at least one latch storage device to said at least one Q output port.

9. Transparent bistable storage apparatus according to claim 2 wherein said apparatus is further operative to block signals at the CLK input pin from reaching said at least one latch storage device in the presence of a selected signal at the transparent enable pin.

10. Transparent bistable storage apparatus according to claim 2 wherein said apparatus is further operative to prevent a signal at said transparent enable pin from reaching said at least one latch storage device in the presence of a selected signal at said SCAN input pin.

11. Transparent bistable storage apparatus according to claim 2 wherein said apparatus being further operative to pass signals at the D input pin and to pass signals at the CLK input pin to said at least one latch storage device such that the signals at the D input pin are latched through said at least one latch storage device.

12. Transparent bistable storage apparatus according to claim 10 wherein said apparatus being further operative to pass signals at the D input pin and to pass signals at the CLK input pin to said at least one latch storage device such that the signals at the D input pin are latched through said at least one latch storage device.

* * * * *